United States Patent
Shyu

(10) Patent No.: US 6,777,785 B1
(45) Date of Patent: Aug. 17, 2004

(54) LEAD FRAME CONTAINING A MASTER AND A SLAVE IC CHIPS AND A TESTING CIRCUIT EMBEDDED WITHIN THE MASTER IC CHIP

(75) Inventor: Rong-Fuh Shyu, Hsinchu (TW)

(73) Assignee: Winbond Electronics Corp., Hsinchu (TW)

(*) Notice: Subject to any disclaimer, the term of this patent is extended or adjusted under 35 U.S.C. 154(b) by 0 days.

(21) Appl. No.: 09/383,150

(22) Filed: Aug. 25, 1999

(51) Int. Cl.[7] ............................................. H10L 23/495
(52) U.S. Cl. ....................... 257/666; 257/711; 257/678; 257/779
(58) Field of Search ................................ 257/666–673

(56) References Cited

U.S. PATENT DOCUMENTS

| | | | |
|---|---|---|---|
| 5,239,448 A | | 8/1993 | Perkins et al. ............... 361/764 |
| 5,784,264 A | | 7/1998 | Tanioka ....................... 361/803 |
| 5,796,746 A | * | 8/1998 | Farnworth et al. ............ 371/28 |
| 6,020,625 A | * | 2/2000 | Qin et al. |
| 6,130,473 A | * | 10/2000 | Mostafazadeh et al. ..... 257/669 |
| 6,134,161 A | * | 10/2000 | Taniguchi et al. |
| 6,160,312 A | * | 12/2000 | Raad .......................... 257/666 |
| 6,366,878 B1 | * | 4/2002 | Grunert ....................... 703/28 |

FOREIGN PATENT DOCUMENTS

JP            02-294061       * 12/1990

* cited by examiner

*Primary Examiner*—Fetsum Abraham
(74) *Attorney, Agent, or Firm*—Christie, Parker & Hale, LLP

(57) ABSTRACT

A lead frame for a semiconductor chip package includes a frame body and at least two chip-receiving windows formed in the frame body. Each chip-receiving window receives a respective integrated circuit chip therein. A plurality of internal connection leads are formed on the frame body adjacent to the chip-receiving windows, and are connected electrically to bonding pads on the integrated circuit chips in the chip-receiving windows such that internal electrical connection among the integrated circuit chips can be established via the internal connection leads. A plurality of external connection leads are formed on the frame body adjacent to at least one of the chip-receiving windows, and are connected electrically to the bonding pads on the integrated circuit chip in the adjacent chip-receiving window. The external connection leads serve as terminal pins such that external electrical connection with the integrated circuit chip in the adjacent chip-receiving window can be established via the external connection leads.

4 Claims, 5 Drawing Sheets

LEAD FRAME CONTAINING A MASTER AND A SLAVE IC CHIPS AND A TESTING CIRCUIT EMBEDDED WITHIN THE MASTER IC CHIP

BACKGROUND OF THE INVENTION

1. Field of the Invention

The invention relates to a semiconductor chip package, more particularly to a lead frame for a semiconductor chip package, a semiconductor chip package that incorporates multiple integrated circuit chips, and a method of fabricating a semiconductor chip package with multiple integrated circuit chips.

2. Description of the Related Art

In the packaging of a semiconductor chip, a lead frame is needed to load the chip and to provide terminal pins for bonding with pads on the chip to permit access to the chip externally of the semiconductor chip package. The bonded chip is encapsulated to fasten the same on the lead frame, to isolate the chip from the outside for protection, and to facilitate use of the chip in the circuit board of an electronic system.

FIG. 1 illustrates a conventional semiconductor chip package 1 that includes a lead frame 10. The lead frame 10 has a frame body that serves as the loader for a single integrated circuit chip 11, and that is formed with a chip-receiving window 12 for placing the integrated circuit chip 11 therein. The frame body of the lead frame 10 is further provided with connection leads 13 that extend outwardly from the frame body to serve as terminal pins for conducting the signals of the integrated circuit chip 11 to the exterior of the semiconductor chip package 1. Bonding pads 110 on the integrated circuit chip 11 are usually wire-bonded to the connection leads 13 for electrical connection therewith.

It is noted that the lead frame 10 of the conventional semiconductor chip package only carries a single integrated circuit chip 11. In view of the rapid advance in semiconductor integrated circuit technology, a fewer number of chips in a system, and even the extreme goal of a single system-on-a-chip (SOC) is desired.

Higher integration of integrated circuits to include as many circuitry as possible into a single semiconductor chip is an effective way of reducing the number of components in a system to shrink the physical size, reducing the power consumption, and increasing the production yield of the system. However, current technology has yet to provide a cost-effective way of achieving this goal of higher integration. For example, a logic integrated circuit that incorporates an embedded DRAM on a single chip always costs much higher than a sole DRAM chip and a sole logic chip. Thus, other alternatives are worthwhile to explore.

One alternative that is currently available is to integrate the circuits in the packaging stage rather than in the semiconductor fabrication stage. A multi-chip module (MCM) packaging approach has been proposed for a high-density package of multiple integrated circuit chips in a single packaged module. For example, U.S. Pat. No. 5,239,448 issued to Perkins et al. teaches the formation of a subsystem by constructing a locally complex area, i.e. a multi-layer MCM carrier, on a flexible carrier, along with other components. U.S. Pat. No. 5,784,264 issued to Tanioka teaches an MCM carrier having wiring layers on front and back surfaces and internally thereof.

It is noted that the MCM packaging approach requires a complicated substrate construction to permit effective integration of the chips thereon, and further requires a lot of additional facilities on the substrate to permit final testing of the packaged module. For example, U.S. Pat. No. 5,784,264 teaches the need to provide a test mode enable bond pad, such as an output enable pad, on each integrated circuit die of an MCM integrated circuit module, a fuse incorporated into the substrate to connect the test mode enable bond pad to a no-connection pin, and a resistor incorporated into the substrate to connect the test mode enable bond pad to a reference voltage pin.

In addition, the MCM packaging approach entails a relatively high cost such that it is worthwhile to be adopted only in a few specific applications.

SUMMARY OF THE INVENTION

Therefore, the main object of the present invention is to provide a lead frame for a semiconductor chip package to overcome the aforementioned disadvantages associated with the use of a substrate in the conventional MCM packaging approach.

Another object of the present invention is to provide a semiconductor chip package that is relatively low cost, that has a relatively simple construction, and that integrates multiple integrated circuit chips, especially when the chips are heavily correlated during system operation, such as a logic chip and its associated memory chips, thereby resulting in the advantages of lower feature size, lower power, and higher production yield when using the package in a system board.

A further object of the present invention is to provide a method of fabricating a semiconductor chip package with multiple integrated circuit chips that offers the advantages of lower feature size, lower power, and higher production yield when used in a system board but without the disadvantages of the conventional MCM packaging approach.

According to one aspect of the invention, a lead frame is adapted for use in a semiconductor chip package, and comprises a frame body formed with at least two chip-receiving windows. Each of the chip-receiving windows is adapted to receive a respective integrated circuit chip therein. Internal connection leads are formed on the frame body adjacent to the chip-receiving windows, and are adapted to be connected electrically to bonding pads on the integrated circuit chips in the chip-receiving windows such that internal electrical connection among the integrated circuit chips can be established via the internal connection leads. External connection leads are formed on the frame body adjacent to at least one of the chip-receiving windows, and are adapted to be connected electrically to the bonding pads on the integrated circuit chip in said at least one of the chip-receiving windows. The external connection leads serve as terminal pins such that external electrical connection with the integrated circuit chip in said at least one of the chip-receiving windows can be established via the external connection leads.

According to another aspect of the invention, a semiconductor chip package comprises a lead frame including a frame body and at least two chip-receiving windows formed in the frame body. Each of at least two integrated circuit chips is received in a respective one of the chip-receiving windows, and has a plurality of bonding pads thereon. Internal connection leads are formed on the frame body adjacent to the chip-receiving windows, and are connected electrically to the bonding pads on the integrated circuit chips in the chip-receiving windows to establish internal electrical connection among the integrated circuit chips.

External connection leads are formed on the frame body adjacent to at least one of the chip-receiving windows. The external connection leads are connected electrically to the bonding pads on the integrated circuit chip in said at least one of the chip-receiving windows, and serve as terminal pins such that external electrical connection with the integrated circuit chip in said at least one of the chip-receiving windows is established via the external connection leads.

According to a further aspect of the invention, a method of fabricating a semiconductor chip package comprises: forming a frame body of a lead frame with at least two chip-receiving windows, a plurality of internal connection leads adjacent to the chip-receiving windows, and a plurality of external connection leads adjacent to at least one of the chip-receiving windows; providing at least two integrated circuit chips, and placing each of the integrated circuit chips in a respective one of the chip-receiving windows; connecting electrically the internal connection leads to bonding pads on the integrated circuit chips in the chip-receiving windows to establish internal electrical connection among the integrated circuit chips; and connecting electrically the external connection leads to the bonding pads on the integrated circuit chip in said at least one of the chip-receiving windows, the external connection leads serving as terminal pins such that external electrical connection with the integrated circuit chip in said at least one of the chip-receiving windows is established via the external connection leads.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
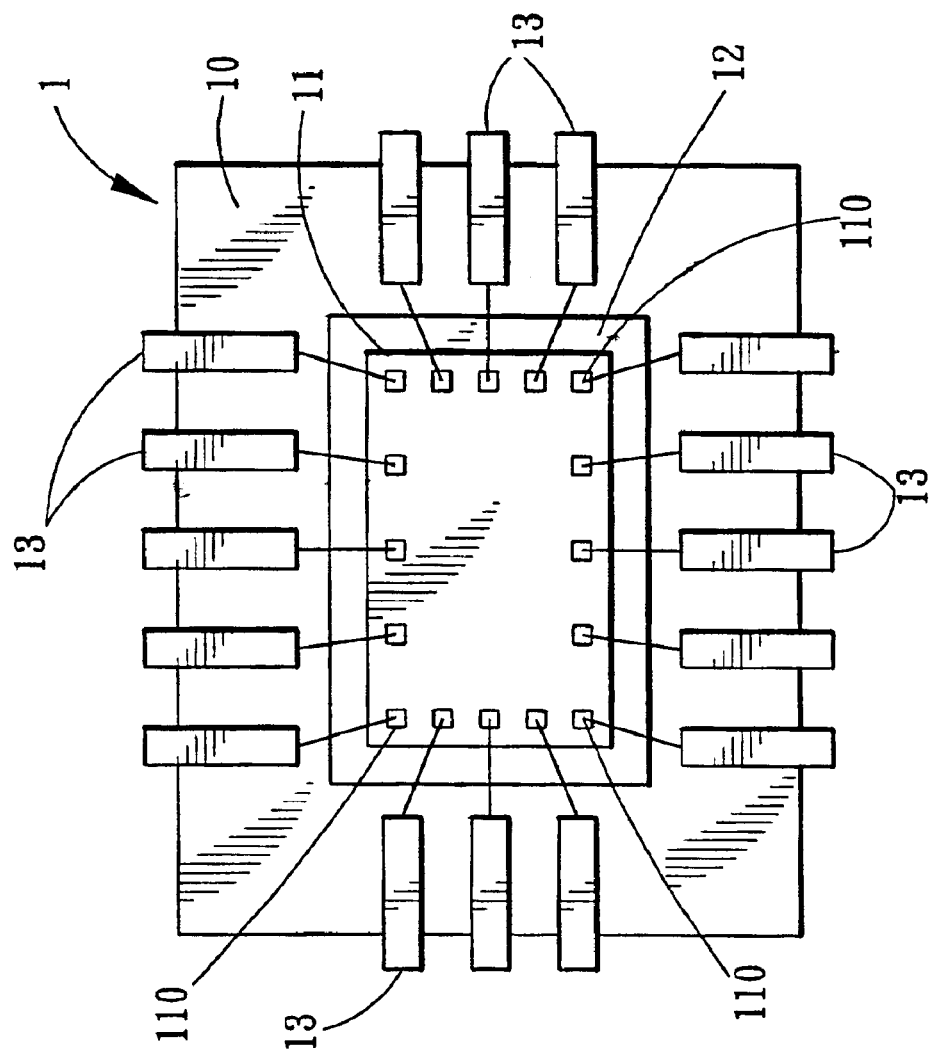
FIG. 1 is a schematic top view illustrating a conventional semiconductor chip package.
Figure 2:
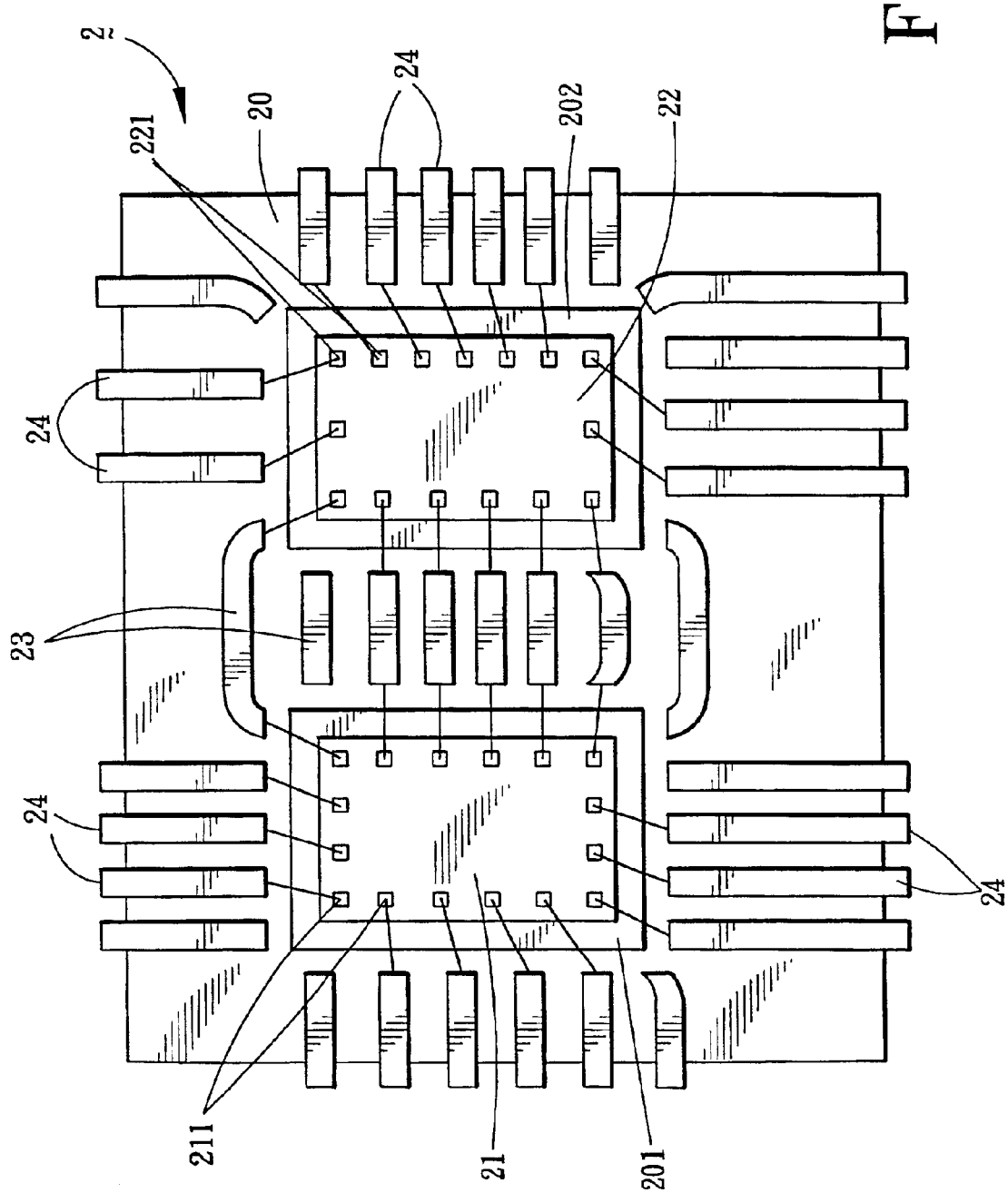
FIG. 2 is a schematic top view illustrating the first preferred embodiment of a semiconductor chip package according to the present invention.

Referring to FIG. 2, the first preferred embodiment of a semiconductor chip package 2 according to the present invention is shown to comprise a lead frame 20, first and second integrated circuit chips 21, 22, internal connection leads 23, and external connection leads 24.

The lead frame 20 includes a frame body that is formed with first and second chip-receiving windows 201, 202.

The first and second integrated circuit chips 21, 22 are received respectively in the first and second chip-receiving windows 201, 202, and have a respective set of bonding pads 211, 221 thereon.

The internal connection leads 23 are formed on the frame body adjacent to the first and second chip-receiving windows 201, 202. The internal connection leads 23, which do not extend outwardly of the frame body, are connected electrically to the bonding pads 211, 221 on the first and second integrated circuit chips 21, 22 in the first and second chip-receiving windows 201, 202, such as by wire-bonding, to establish internal electrical connection between the first and second integrated circuit chips 21, 22, which are correlated in operation.

The external connection leads 24 are formed on the frame body adjacent to the first and second chip-receiving windows 201, 202. The external connection leads 24 are connected electrically to the bonding pads 211, 221 on the first and second integrated circuit chips 21, 22 in the first and second chip-receiving windows 201, 202, such as by wire-bonding, and extend outwardly of the frame body to serve as terminal pins such that external electrical connection with the first and second integrated circuit chips 21, 22 in the first and second chip-receiving windows 201, 202 is established via the external connection leads 24.

Because two integrated circuit chips 21, 22 can be packed together in the lead frame 20, the number of chip packages is reduced, and the feature size of a system board that requires the integrated circuit chips 21, 22 is similarly reduced.

Figure 3:
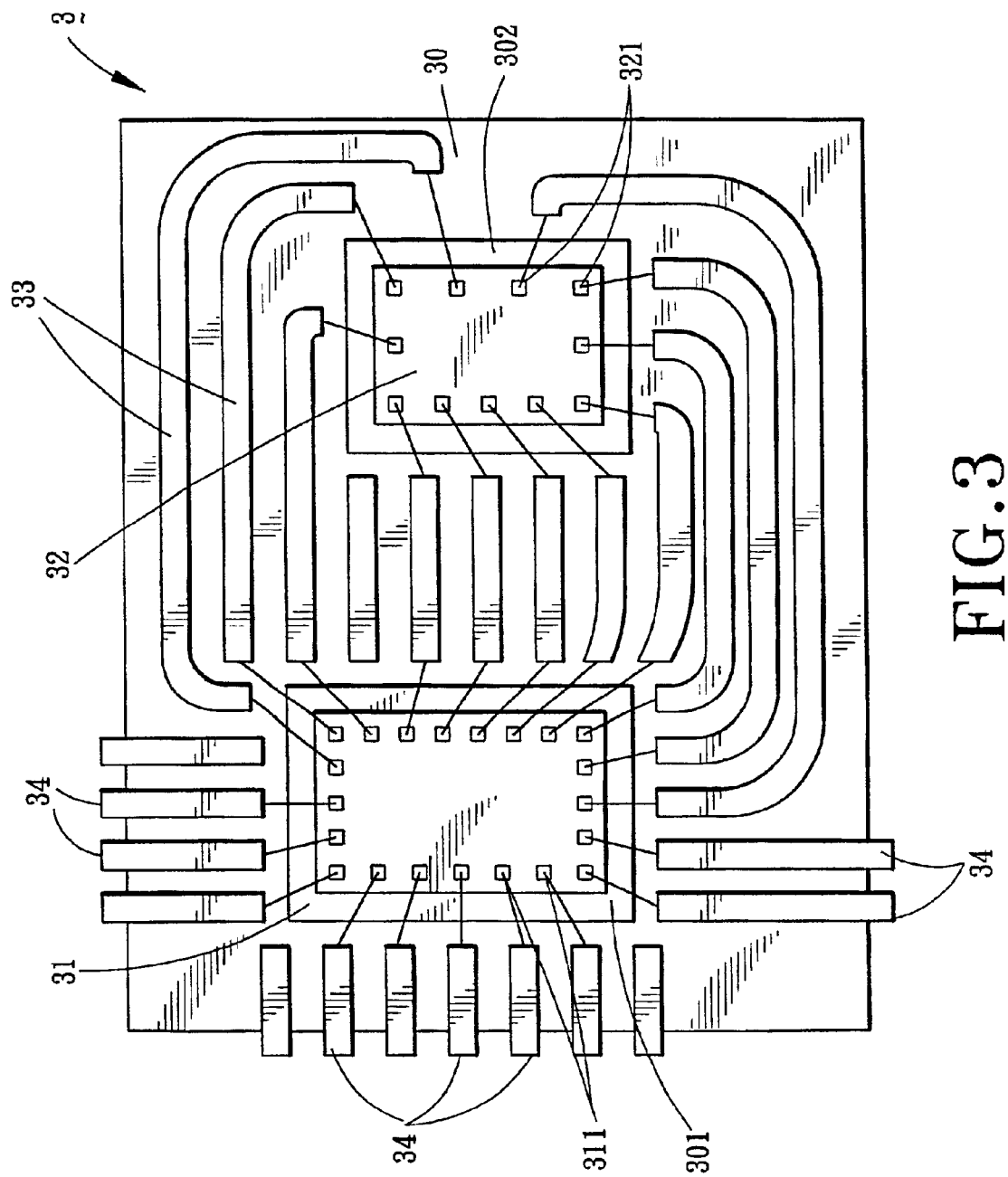
FIG. 3 is a schematic top view illustrating the second preferred embodiment of a semiconductor chip package according to the present invention.

FIG. 3 illustrates the second preferred embodiment of a semiconductor chip package 3 according to the present invention. Like the previous embodiment, the semiconductor chip package 3 comprises a lead frame 30, first and second integrated circuit chips 31, 32, internal connection leads 33, and external connection leads 34.

The lead frame 30 includes a frame body that is formed with first and second chip-receiving windows 301, 302.

The first and second integrated circuit chips 31, 32 are received respectively in the first and second chip-receiving windows 301, 302, and have a respective set of bonding pads 311, 321 thereon. The first integrated circuit chip 31 serves as a master integrated circuit chip, whereas the second integrated circuit chip 32 serves as a slave integrated circuit chip.

The internal connection leads 33 are formed on the frame body adjacent to the first and second chip-receiving windows 301, 302. The internal connection leads 33, which do not extend outwardly of the frame body, are connected electrically to all of the bonding pads 321 on the second integrated circuit chip 32 and to appropriate ones of the bonding pads 311 on the first integrated circuit chip 31, such as by wire-bonding, to establish internal electrical connection between the first and second integrated circuit chips 31, 32, which are fully synchronized in operation.

The external connection leads 34 are formed on the frame body adjacent to the first chip-receiving window 301. The external connection leads 34 are connected electrically to some of the bonding pads 311 on the first integrated circuit chip 31, such as by wire-bonding, and extend outwardly of the frame body to serve as terminal pins such that external electrical connection with the first integrated circuit chip 31 is established via the external connection leads 34.

A practical implementation of the second preferred embodiment is one in which the master integrated circuit chip is a logic functional chip, and the slave integrated circuit chip is an associated DRAM chip that is accessed by the master integrated circuit chip. The implementation as such is suitable for many applications that do not warrant the high cost of adopting an embedded DRAM technology to provide a single chip in order to achieve the advantages of a smaller feature size, a lower number of packages, a flexible interface configuration, etc.

Figure 4:
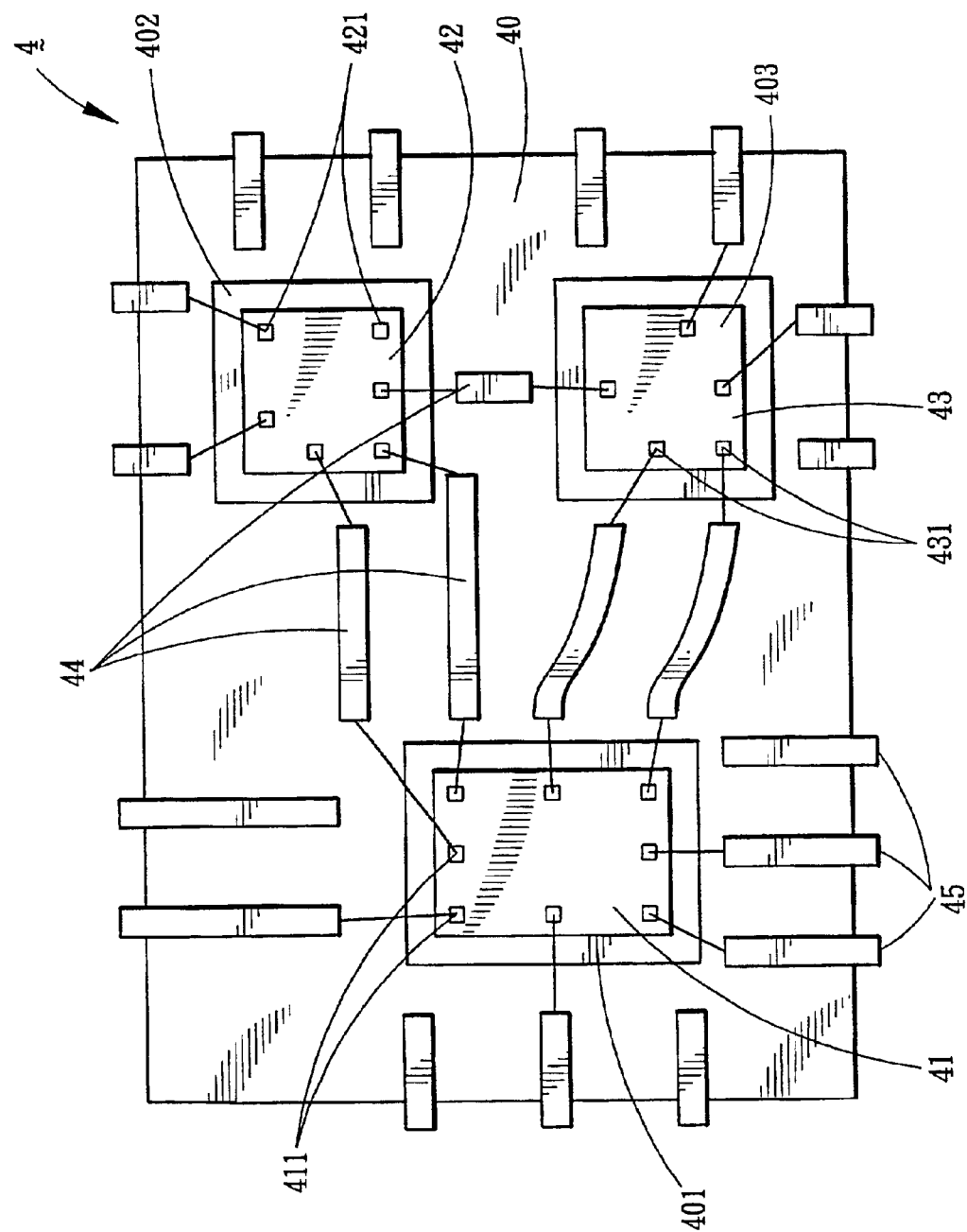
FIG. 4 is a schematic top view illustrating the third preferred embodiment of a semiconductor chip package according to the present invention.

FIG. 4 illustrates the third preferred embodiment of a semiconductor chip package 4 according to the present invention. The semiconductor chip package 4 comprises a lead frame 40, first, second and third integrated circuit chips 41, 42, 43, internal connection leads 44, and external connection leads 45.

The lead frame 40 includes a frame body that is formed with first, second and third chip-receiving windows 401, 402, 403.

The first, second and third integrated circuit chips 41, 42, 43 are received respectively in the first, second and third chip-receiving windows 401, 402, 403, and have a respective set of bonding pads 411, 421, 431 thereon.

The internal connection leads 44 are formed on the frame body adjacent to the first, second and third chip-receiving windows 401, 402, 403. The internal connection leads 44, which do not extend outwardly of the frame body, are connected electrically to the bonding pads 411, 421, 431 on the integrated circuit chips 41, 42, 43, such as by wire-bonding, to establish internal electrical connection thereamong.

The external connection leads 45 are formed on the frame body adjacent to the chip-receiving windows 401, 402, 403. The external connection leads 45 are connected electrically to the bonding pads 411, 421, 431 on the integrated circuit chips 41, 42, 43, such as by wire-bonding, and extend outwardly of the frame body to serve as terminal pins such that external electrical connection with the integrated circuit chips 41, 42, 43 is established via the external connection leads 45.

In the third preferred embodiment, any one of the integrated circuit chips 41, 42, 43 can be a master integrated circuit chip, as long as external electrical connection can be established therewith via the external connection leads 45. Accordingly, any one of the integrated circuit chips 41, 42, 43 can be a slave integrated circuit chip. In this case, external electrical connection via the external connection leads 45 is not required therefor.

Figure 5:
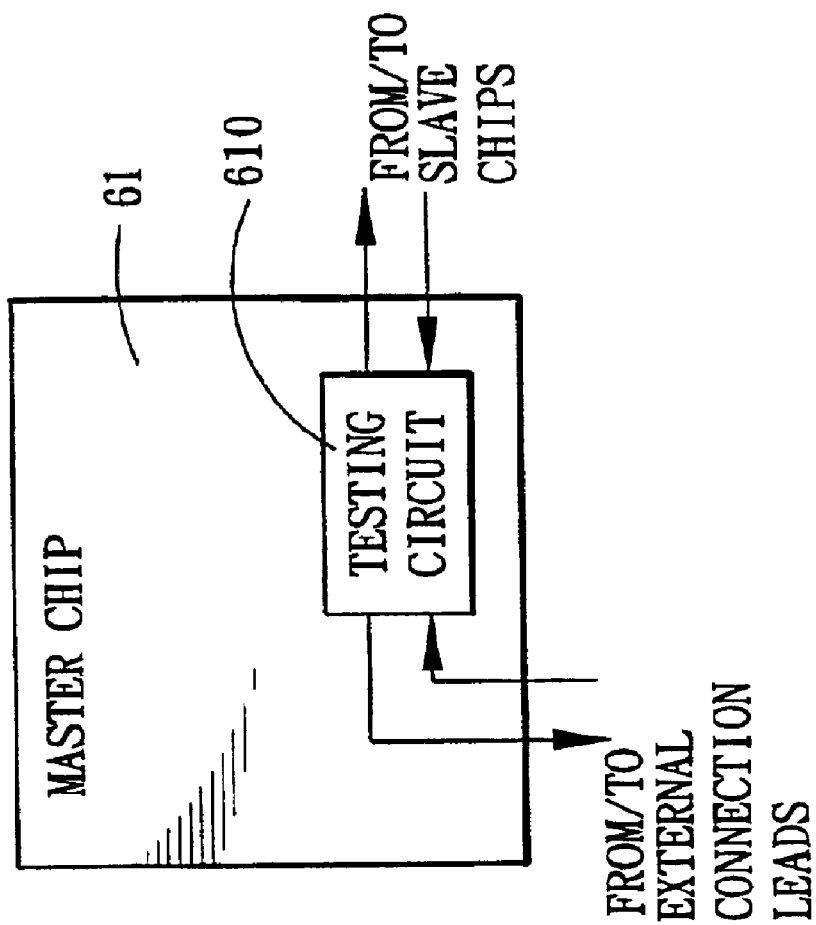
FIG. 5 is a schematic circuit block diagram illustrating a master integrated circuit chip of the fourth preferred embodiment of a semiconductor chip package according to the present invention.

FIG. 5 illustrates a master integrated circuit chip 61 of the fourth preferred embodiment of a semiconductor chip package according to the present invention. As shown, the master integrated circuit chip 61 includes an embedded testing circuit 610 that serves as part of the mechanism responsible for final testing of the slave integrated circuit chip(s) in the semiconductor chip package because no dedicated terminal pins are assigned to the slave integrated circuit chip(s). The testing circuit 610 receives stimulating signals from a tester (not shown) via the external connection leads of the semiconductor chip package, gives appropriate stimulus to the slave integrated circuit chip(s) via the internal connection leads, receives the response of the slave integrated circuit chip(s) via the internal connection leads, and outputs appropriate information to the tester via the external connection leads. There may be a variety of final test mechanisms available for the slave integrated circuit chip(s) in a single semiconductor chip package. However, the testing circuit 610 embedded in the master integrated circuit chip 61 as disclosed herein is necessary to act as a bridge between the slave integrated circuit chip(s) and the tester. Although the embedded testing circuit 610 of the master integrated circuit chip 61 is motivated by the necessity of providing means for final testing of the slave integrated circuit chip(s), the embedded testing circuit 610 can also be used to perform the same testing function on other master integrated circuit chip(s), if any, in the semiconductor chip package. In this case, only one of the master integrated circuit chip(s) 61 includes the testing circuit 610. The other master integrated circuit chip(s)can be treated as a slave integrated circuit chip during the final testing of the semiconductor chip package.

While the present invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

I claim:

1. A semiconductor chip package, comprising:
   a lead frame including a frame body, at least two chip-receiving windows formed in said frame body, a plurality of internal connection leads formed on said frame body adjacent to said chip-receiving windows, and a plurality of external connection leads formed on said frame body adjacent to at least one of said chip-receiving windows; and
   at least two integrated circuit chips, each of which is received in a respective one of said chip-receiving windows and has a plurality of bonding pads formed thereon, wherein said internal connection leads are electrically connected to said bonding pads on said at least two integrated circuit chips in said at least two chip-receiving windows to establish internal electrical connection among said at least two integrated circuit chips, wherein one of said integrated circuit chips is a master integrated circuit chip, and another of said integrated circuit chips is a slave integrated circuit chip, wherein said master integrated circuit chip includes an embedded testing circuit to permit testing of said slave integrated circuit chip that is connected thereto during a testing process of said semiconductor chip package.

2. The semiconductor chip package as claimed in claim 1, wherein said internal connection leads are wire-bonded to said bonding pads on said at least two integrated circuit chips in said at least two chip-receiving windows.

3. The semiconductor chip package as claimed in claim 1, wherein there are no external connection leads electrically connected to any bonding pads on said slave integrated circuit chip, said external connection leads serving as terminal pins such that external electrical connection with said slave integrated circuit chip is established only via said master integrated circuit chip.

4. The semiconductor chip package of claim 1, wherein for the testing process of said semiconductor chip package, said master integrated circuit chip is configured to receive stimulating signals via said external connection leads to stimulate said at least one slave integrated circuit chip via said internal connection leads in response to the stimulating signals, to receive stimulation response of said at least one slave integrated circuit chip via said internal connection leads, and to output information corresponding to the stimulation response via said external connection leads.

* * * * *